United States Patent
Wu

(10) Patent No.: US 10,461,741 B2
(45) Date of Patent: Oct. 29, 2019

(54) POWER SWITCH AND SEMICONDUCTOR DEVICE THEREOF

(71) Applicant: uPI semiconductor corporation, Zhubei, Hsinchu County (TW)

(72) Inventor: Chia-Long Wu, Hsinchu County (TW)

(73) Assignee: UPI SEMICONDUCTOR CORPORATION, Zhubei, Hsinchu County (TW)

( * ) Notice: Subject to any disclaimer, the term of this patent is extended or adjusted under 35 U.S.C. 154(b) by 0 days.

(21) Appl. No.: 15/928,306

(22) Filed: Mar. 22, 2018

(65) Prior Publication Data
US 2018/0302084 A1    Oct. 18, 2018

(30) Foreign Application Priority Data
Apr. 18, 2017   (TW) .............................. 106112984 A

(51) Int. Cl.
H01L 27/088   (2006.01)
H03K 17/687   (2006.01)
H01L 29/36    (2006.01)

(52) U.S. Cl.
CPC ....... H03K 17/6871 (2013.01); H01L 27/088 (2013.01); H01L 29/36 (2013.01)

(58) Field of Classification Search
CPC ............... H01L 27/0617; H01L 27/088; H01L 27/0705
See application file for complete search history.

(56) References Cited

U.S. PATENT DOCUMENTS

| | | | | |
|---|---|---|---|---|
| 5,635,821 A * | 6/1997 | Smith | .................. | H02J 7/0031 320/103 |
| 5,929,615 A * | 7/1999 | D'Angelo | .............. | G05F 1/618 323/222 |
| 7,994,761 B2 * | 8/2011 | Markowski | ............. | G05F 1/618 323/270 |
| 8,455,948 B2 * | 6/2013 | Weis | ............... | H01L 21/823418 257/339 |
| 8,569,842 B2 * | 10/2013 | Weis | .................. | H01L 27/0207 257/194 |
| 2002/0167056 A1 * | 11/2002 | Sakamoto | ........... | H01L 27/0635 257/368 |
| 2005/0167742 A1 * | 8/2005 | Challa | ................. | H01L 21/3065 257/328 |
| 2006/0214221 A1 * | 9/2006 | Challa | ................. | H01L 21/3065 257/328 |
| 2007/0086220 A1 * | 4/2007 | Chang | ................... | G06F 1/1616 363/21.16 |
| 2007/0215952 A1 * | 9/2007 | Ozawa | ............... | H01L 27/1203 257/371 |
| 2010/0090282 A1 * | 4/2010 | Ozawa | ............... | H01L 27/1203 257/349 |

(Continued)

*Primary Examiner* — George R Fourson, III
(74) *Attorney, Agent, or Firm* — McClure, Qualey & Rodack, LLP

(57) ABSTRACT

A power switch and a semiconductor device thereof are disclosed. The power switch device includes a first transistor cell, a second transistor cell, a body region and a conductive layer. The first transistor cell includes a first electrode. The second transistor cell includes a second electrode. The body region is disposed between the first transistor cell and the second transistor cell. The conductive layer is electrically connected with the body region, the first electrode and the second electrode respectively.

12 Claims, 5 Drawing Sheets

(56) References Cited

U.S. PATENT DOCUMENTS

| | | | |
|---|---|---|---|
| 2013/0162322 A1* | 6/2013 | Tao | H03K 17/04123 327/381 |
| 2015/0035586 A1* | 2/2015 | Weis | H03K 17/687 327/436 |
| 2015/0236588 A1* | 8/2015 | Branca | H02M 3/158 323/271 |
| 2015/0249449 A1* | 9/2015 | Cai | H03K 17/063 327/436 |
| 2015/0270333 A1* | 9/2015 | Yang | H01L 29/063 257/337 |
| 2016/0172979 A1* | 6/2016 | Xue | H02M 1/083 323/235 |
| 2016/0351699 A1* | 12/2016 | Boos | H01L 29/0634 |
| 2017/0323884 A1* | 11/2017 | Huerner | H01L 27/0266 |

\* cited by examiner

POWER SWITCH AND SEMICONDUCTOR DEVICE THEREOF

BACKGROUND OF THE INVENTION

1. Field of the Invention

The invention relates to a power switch; in particular, to the power switch and a semiconductor device thereof.

2. Description of the Prior Art

FIG. 1 illustrates a schematic diagram of a conventional N-type metal-oxide-semiconductor field effect transistor (N-MOSFET) power switch. Since a base electrode B of the N-MOSFET power switch is grounded, the N-MOSFET power switch has large on-resistance (Ron). Therefore, as shown in FIG. 2, the base electrode B of the N-MOSFET power switch can be practically coupled to a source electrode S to reduce its on-resistance (Ron).

However, when the N-MOSFET power switch in FIG. 2 is switched off, its body diode BD will be maintained conductive in one direction. This will cause the current flowing back from the voltage Vout of the source electrode S to the voltage VH of the drain electrode D. Therefore, as shown in FIG. 3, not only the transistor main body MB of the N-MOSFET power switch, but also a bulk MOSFET BMOS1 between the base electrode B and the drain electrode D and a bulk MOSFET BMOS2 between the base electrode B and the source electrode S can be formed and switched to avoid the current flowing back from the voltage Vout to the voltage VH.

FIG. 4 illustrates a schematic diagram of the layout of the conventional N-MOSFET power switch in FIG. 3. Because the conventional bulk MOSFETs BMOS1 and BMOS2 are disposed out of the transistor main body MB and electrically connected with the transistor main body MB through the conductive layer, the distances from the different regions (e.g., the first region RG1 and the second region RG2) in the transistor main body MB to the bulk MOSFETs BMOS1 and BMOS2 are different; therefore, the impedance of the transistor main body MB will be inhomogeneous. For example, since the distance from the second region RG2 to the bulk MOSFETs BMOS1 and BMOS2 is larger than that from the first region RG1 to the bulk MOSFETs BMOS1 and BMOS2, the second region RG2 has larger impedance than the first region RG1 and the second region RG2 is easier to be burned than the first region RG1.

SUMMARY OF THE INVENTION

Therefore, the invention provides a power switch and a semiconductor device thereof to overcome the above-mentioned problems in the prior art.

An embodiment of the invention is power switch. In this embodiment, the power switch includes a first transistor cell, a second transistor cell, a body region and a conductive layer. The first transistor cell includes a first electrode. The second transistor cell includes a second electrode. The body region is disposed between the first transistor cell and the second transistor cell. The conductive layer is electrically connected with the body region, the first electrode and the second electrode respectively.

In an embodiment, the body region is adjacent to the first electrode and the second electrode respectively.

In an embodiment, the first electrode is a first drain electrode of the first transistor cell and the second electrode is a second source electrode of the second transistor cell.

In an embodiment, the first transistor cell further includes a first source electrode and a first gate electrode, and the first source electrode is coupled to a first voltage and the first gate electrode is controlled by a second voltage; the second transistor cell further includes a second drain electrode and a second gate electrode, and the second drain electrode is coupled to the second voltage and the second gate electrode is controlled by the first voltage.

In an embodiment, when the power switch is turned on, the first transistor cell is conducted but the second transistor cell is not conducted, and a base electrode voltage of the body region is maintained at a first voltage; when the power switch is turned off, the second transistor cell is conducted but the first transistor cell is not conducted, and the base electrode voltage is maintained at a second voltage.

In an embodiment, a base electrode voltage of the body region is selectively maintained at a lower one of a first voltage and a second voltage.

Another embodiment of the invention is a semiconductor device of a power switch. The semiconductor device includes a substrate, a first well, a second well, a first transistor cell, a second transistor cell and a metal layer. The substrate has a first conductive material. The first well is disposed on the substrate and has a second conductive material. The second well is disposed on the first well and has the first conductive material. The first transistor cell is disposed in the second well and has a first electrode. The second transistor cell is disposed in the second well and has a second electrode. The metal layer is disposed on a surface of the semiconductor device and electrically connected with the first electrode, the second electrode and the second well respectively.

In an embodiment, the semiconductor device further includes a first doped region, disposed in the second well and electrically connected with the metal layer, having the first conductive material.

In an embodiment, the first doped region is disposed between the first transistor cell and the second transistor cell.

In an embodiment, a doping concentration of the first conductive material in the first doped region is higher than that of the first conductive material in the second well and the substrate.

In an embodiment, the semiconductor device further includes a second doped region, disposed in the second well and electrically connected with the first electrode or the second electrode, having the second conductive material.

In an embodiment, the first well is coupled to an operating voltage.

In an embodiment, the substrate is coupled to a ground voltage.

Compared to the prior arts, the power switch and the semiconductor device thereof in the invention have the following advantages and effects:

(1) Because the source electrode in the power switch of the invention is not disposed out of the power switch and the source electrode is connected with the base electrode, the inner impedance of the transistor main body can become more homogeneous to avoid the high impedance region burned.

(2) Because the bulk MOSFET in the power switch of the invention is internalized in the transistor main body, the base electrode and the source electrode are connected in the active area of the transistor. Therefore, it can achieve the effect of reducing chip area without disposing the bulk MOSFET out of the transistor main body.

The advantage and spirit of the invention may be understood by the following detailed descriptions together with the appended drawings.

BRIEF DESCRIPTION OF THE APPENDED DRAWINGS

FIG. 1~FIG. 3 illustrate schematic diagrams of different N-MOSFET power switches in the prior arts respectively.

DETAILED DESCRIPTION OF THE INVENTION

Figures 1, 2, 3:
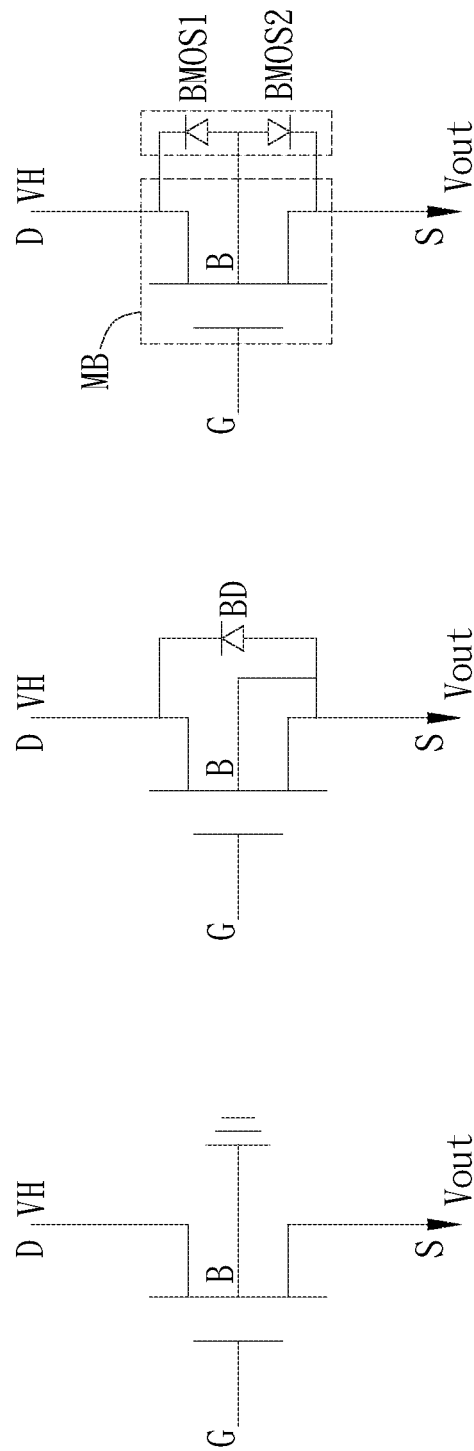
Figure 4:
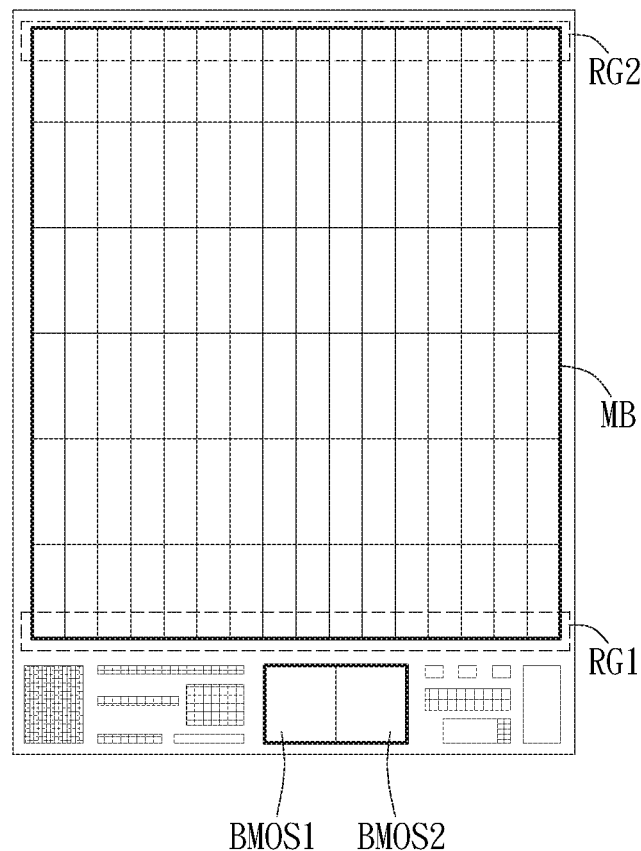
FIG. 4 illustrates the layout of the conventional N-MOSFET power switch in FIG. 3.

Exemplary embodiments of the present invention are referenced in detail now, and examples of the exemplary embodiments are illustrated in the drawings. Further, the same or similar reference numerals of the elements/components in the drawings and the detailed description of the invention are used on behalf of the same or similar parts. In the following embodiments, if an element is "connected" or "coupled" to another element, the element may be directly connected or coupled to the another element, or there may be any elements or specific materials (e.g., colloid or solder) disposed between the element and the another element.

A preferred embodiment of the invention is a power switch. In this embodiment, the power switch can be an N-type metal-oxide-semiconductor field effect transistor (N-MOSFET) power switch or a P-type metal-oxide-semiconductor field effect transistor (P-MOSFET) power switch, but not limited to this.

Figure 5:
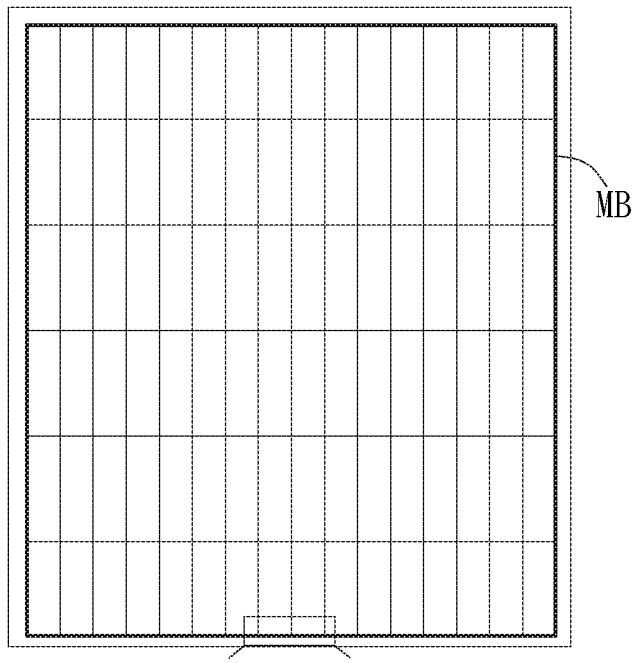
FIG. 5 and FIG. 6 illustrate the layouts of the power switch in the invention.
Figure 6:
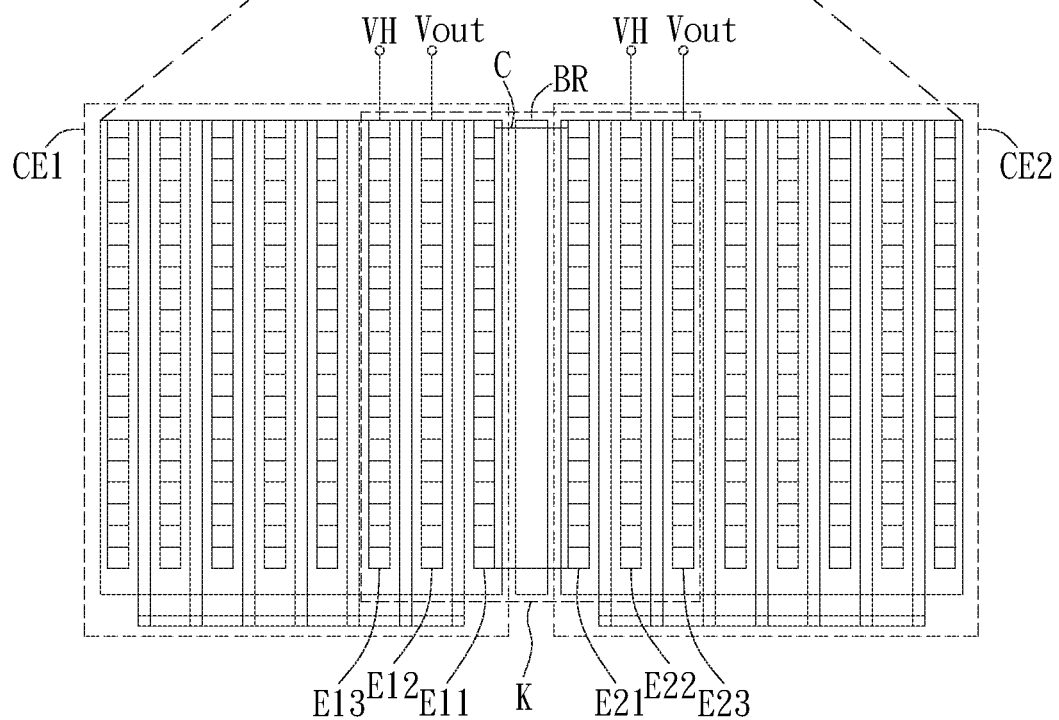

Please refer to FIG. 5 and FIG. 6. FIG. 5 and FIG. 6 illustrate the layouts of the power switch in the invention.

The power switch 5 includes a transistor main body MB. The transistor main body MB includes a plurality of transistor cells. A first transistor cell CE1 and a second transistor cell CE2 are adjacently disposed. The first transistor cell CE1 includes a plurality of electrodes E11, E12, E13, . . . ; the second transistor cell CE2 includes a plurality of electrodes E21, E22, E23, . . . . The power switch 5 further includes a body region BR and a conductive layer C. The body region BR is disposed between the first transistor cell CE1 and the second transistor cell CE2, and the body region BR is adjacent to the electrode E11 of the first transistor cell CE1 and the electrode E21 of the second transistor cell CE2 respectively. The conductive layer C is electrically connected with the body region BR, the electrode E11 of the first transistor cell CE1 and the electrode E21 of the second transistor cell CE2 respectively to form a bulk MOSFET K.

It should be noticed that the electrode E11 is an electrode closest to the body region BR among the electrodes of the first transistor cell CE1, and the electrode E21 is an electrode closest to the body region BR among the electrodes of the second transistor cell CE2. That is to say, the conductive layer C is only electrically connected with the electrodes closest to the body region BR in the first transistor cell CE1 and the second transistor cell CE2 respectively instead of being electrically connected with other electrodes in the first transistor cell CE1 and the second transistor cell CE2.

In this embodiment, the electrode E11 is a drain electrode of the first transistor cell CE1 and the electrode E21 is a source electrode of the second transistor cell CE2, but not limited to this. The electrodes E12 and E13 of the first transistor cell CE1 are a drain electrode and a source electrode of the first transistor cell CE1 respectively. The electrode E12 (the drain electrode) of the first transistor cell CE1 is controlled by a second voltage Vout and the electrode E13 (the source electrode) of the first transistor cell CE1 is coupled to a first voltage VH. The electrodes E22 and E23 of the second transistor cell CE2 are a source electrode and a drain electrode of the second transistor cell CE2 respectively. The electrode E22 (the source electrode) of the second transistor cell CE2 is controlled by the first voltage VH and the electrode E23 (the drain electrode) of the second transistor cell CE2 is coupled to the second voltage Vout. In practical applications, the first voltage VH can be an input voltage of the power switch 5 and the second voltage Vout can be an output voltage of the power switch 5, but not limited to this.

Figure 7:
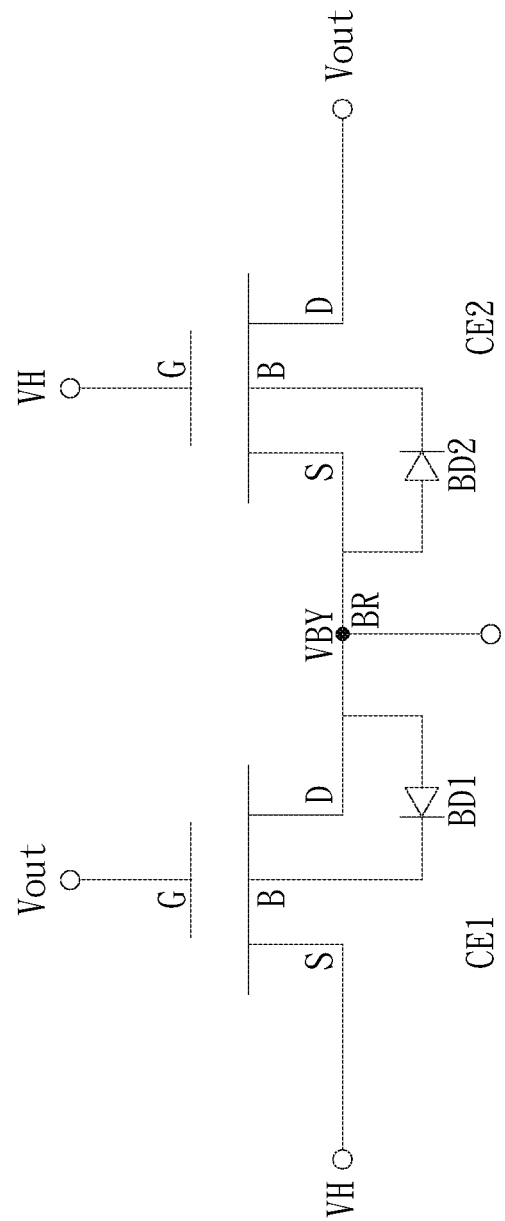
FIG. 7 illustrates an equivalent circuit diagram of the bulk MOSFET in the power switch of the invention.

Please refer to FIG. 7. FIG. 7 illustrates an equivalent circuit diagram of the bulk MOSFET in the power switch. As shown in FIG. 7, the body region BR is disposed between the first transistor cell CE1 and the second transistor cell CE2 and the body region BR is coupled to the drain electrode D of the first transistor cell CE1 and the source electrode S of the second transistor cell CE2 respectively. The gate electrode G of the first transistor cell CE1 is controlled by the second voltage Vout and the source electrode S of the first transistor cell CE1 is coupled to the first voltage VH. The gate electrode G of the second transistor cell CE2 is controlled by the first voltage VH and the drain electrode D of the second transistor cell CE2 is coupled to the second voltage Vout.

In this embodiment, the body region BR has a base electrode voltage VBY and the base electrode voltage VBY will be selectively maintained at the lower of the first voltage VH and the second voltage Vout. For example, when the power switch 5 is turned on, the second voltage Vout is at high-level and the first transistor cell CE1 controlled by the second voltage Vout is conducted, but the second transistor cell CE2 is not conducted and the base electrode voltage VBY of the body region BR is maintained at the first voltage VH. When the power switch 5 is turned off, the second voltage Vout is at low-level and the first transistor cell CE1 controlled by the second voltage Vout is not conducted, but the second transistor cell CE2 is conducted and the base electrode voltage VBY of the body region BR is maintained at the second voltage Vout.

Figure 8:
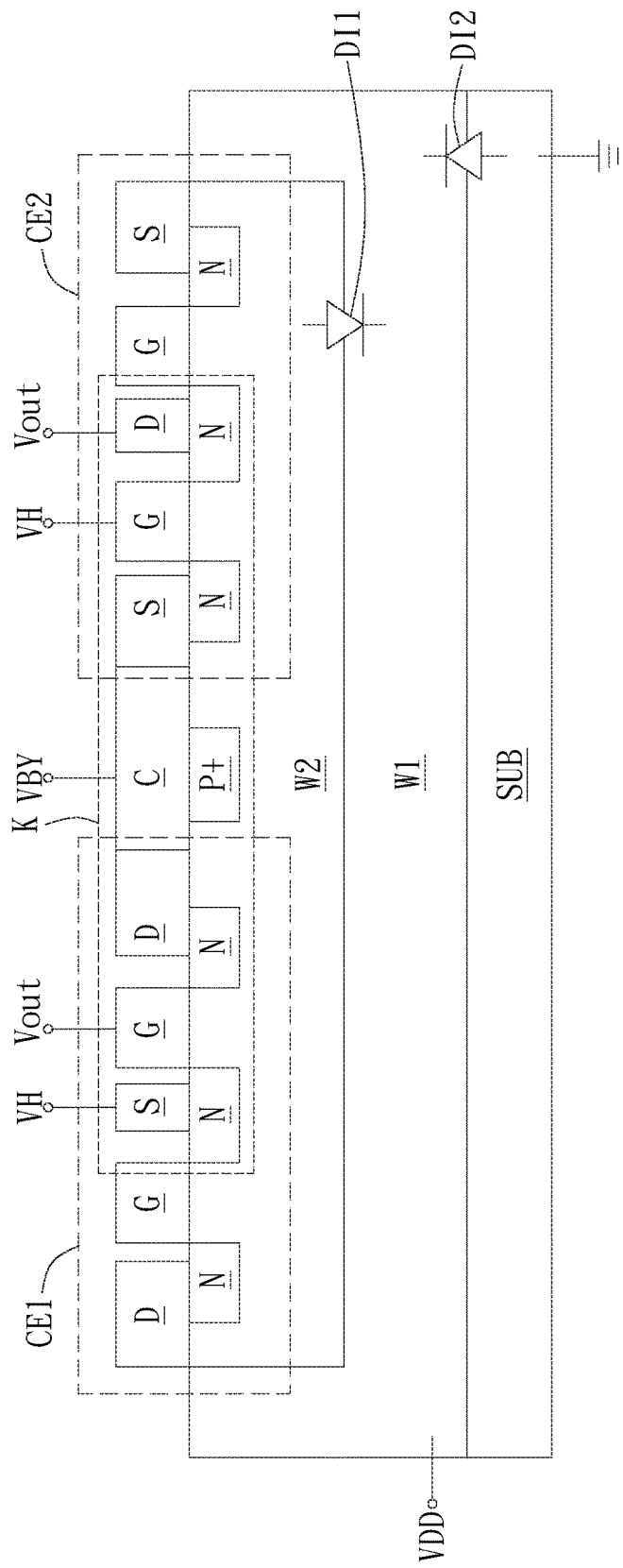
FIG. 8 illustrates a cross-sectional structure of the semiconductor device in the power switch of the invention.

Please refer to FIG. 8. FIG. 8 illustrates a cross-sectional structure of the semiconductor device in the power switch. The portion framed by dotted line in FIG. 8, corresponding to the portion framed by dotted line in FIG. 6, represents the bulk MOSFET structure. As shown in FIG. 8, the semiconductor device 50 of the power switch includes a substrate SUB, a first well W1, a second well W2, a first doped region P+, a first transistor cell CE1, a second transistor cell CE2 and a metal layer C. The substrate SUB, the second well W2 and the first doped region P+ have a first conductive material. The doping concentration of the first conductive material in the first doped region P+ is higher than that of the first conductive material in the second well W2 and the substrate SUB. The first well W1 has a second conductive material. Therefore, the diode DI1 is formed between the second well W2 having the first conductive material and the first well W1 having the second conductive material and the diode DI2 is formed between the first well W1 having the second conductive material and the substrate SUB having the first conductive material. In this embodiment, the first conductive material is P-type conductive material and the second conductive material is N-type conductive material, but not limited to this.

The first well W1 is disposed on the substrate SUB. The second well W2 is disposed on the first well W1 and used as the body region. The first doped region P+, the first transistor cell CE1 and the second transistor cell CE2 are disposed in the second well W2. The first doped region P+ is disposed between the first transistor cell CE1 and the second transistor cell CE2. In this embodiment, the substrate SUB is grounded and the first well W1 is coupled to the operating voltage VDD, but not limited to this.

The first transistor cell CE1 includes a plurality of electrodes and a plurality of second doped regions. The second doped regions N are disposed in the second well W2 and have the second conductive material (e.g., the N-type conductive material). The electrodes are disposed on the surface of the semiconductor device 50. The drain electrode D and the source electrode S are electrically connected with the second doped regions N. The source electrode S is coupled to the first voltage VH and the gate electrode G is coupled to the second voltage Vout.

Similarly, the second transistor cell CE2 includes a plurality of electrodes and a plurality of second doped regions. The second doped regions N are disposed in the second well W2 and have the second conductive material (e.g., the N-type conductive material). The electrodes are disposed on the surface of the semiconductor device 50. The drain electrode D and the source electrode S are electrically connected with the second doped regions N. The drain electrode D is coupled to the second voltage Vout and the gate electrode G is coupled to the first voltage VH.

The metal layer C is disposed on the surface of the semiconductor device 50 and between the first transistor cell CE1 and the second transistor cell CE2. The metal layer C is electrically connected with the drain electrode D closest to the metal layer C in the first transistor cell CE1, the source electrode S closest to the metal layer C in the second transistor cell CE2, the first doped region P+ and the second well W2 respectively. Therefore, the metal layer C, the drain electrode D in the first transistor cell CE1, the source electrode S in the second transistor cell CE2, the first doped region P+ and the second well W2 have the same voltage level (e.g., the base electrode voltage VBY of the second well W2 used as body region).

It should be noticed that the conductive layer C is only electrically connected with the drain electrode D closest to the metal layer C in the first transistor cell CE1 and the source electrode S closest to the metal layer C in the second transistor cell CE2 respectively instead of being electrically connected with other electrodes in the first transistor cell CE1 and the second transistor cell CE2.

In this embodiment, the base electrode voltage VBY of the second well W2 used as body region will be selectively maintained at the lower of the first voltage VH and the second voltage Vout. For example, when the power switch is turned on, the first transistor cell CE1 is conducted and the second transistor cell CE2 is not conducted, so that the base electrode voltage VBY of the second well W2 is maintained at the first voltage VH. When the power switch is turned off, the second transistor cell CE2 is conducted and the first transistor cell CE1 is not conducted, so that the base electrode voltage VBY of the second well W2 is maintained at the second voltage Vout.

Compared to the prior arts, the power switch and the semiconductor device thereof in the invention have the following advantages and effects:

(1) Because the source electrode in the power switch of the invention is not disposed out of the power switch and the source electrode is connected with the base electrode, the inner impedance of the transistor main body can become more homogeneous to avoid the high impedance region burned.

(2) Because the bulk MOSFET in the power switch of the invention is internalized in the transistor main body, the base electrode and the source electrode are connected in the active area of the transistor. Therefore, it can achieve the effect of reducing chip area without disposing the bulk MOSFET out of the transistor main body.

With the example and explanations above, the features and spirits of the invention will be hopefully well described. Those skilled in the art will readily observe that numerous modifications and alterations of the device may be made while retaining the teaching of the invention. Accordingly, the above disclosure should be construed as limited only by the metes and bounds of the appended claims.

What is claimed is:
1. A power switch, comprising:
   a first transistor cell comprising a first electrode;
   a second transistor cell comprising a second electrode;
   a body region disposed between the first transistor cell and the second transistor cell; and
   a conductive layer electrically connected with the body region, the first electrode and the second electrode respectively,
   wherein the body region has a base electrode voltage selectively maintained at a lower one of a first voltage and a second voltage, the first transistor cell is controlled by the second voltage and the second transistor cell is controlled by the first voltage.
2. The power switch of claim 1, wherein the body region is adjacent to the first electrode and the second electrode respectively.
3. The power switch of claim 1, wherein the first electrode is a first drain electrode of the first transistor cell and the second electrode is a second source electrode of the second transistor cell.
4. The power switch of claim 3, wherein the first transistor cell further comprises a first source electrode and a first gate electrode, and the first source electrode is coupled to a first voltage and the first gate electrode is controlled by a second voltage; the second transistor cell further comprises a second drain electrode and a second gate electrode, and the second drain electrode is coupled to the second voltage and the second gate electrode is controlled by the first voltage.
5. The power switch of claim 1, wherein when the power switch is turned on, the first transistor cell is conducted but the second transistor cell is not conducted, and a base electrode voltage of the body region is maintained at a first voltage; when the power switch is turned off, the second transistor cell is conducted but the first transistor cell is not conducted, and the base electrode voltage is maintained at a second voltage.
6. A semiconductor device of a power switch, comprising:
   a substrate having a first conductive material;
   a first well, disposed on the substrate, having a second conductive material;

a second well, disposed on the first well, having the first conductive material;

a first transistor cell, disposed in the second well, having a first electrode;

a second transistor cell, disposed in the second well, having a second electrode; and a metal layer, disposed on a surface of the semiconductor device and electrically connected with the first electrode, the second electrode and the second well respectively.

7. The semiconductor device of claim 6, further comprising:

a first doped region, disposed in the second well and electrically connected with the metal layer, having the first conductive material.

8. The semiconductor device of claim 7, wherein the first doped region is disposed between the first transistor cell and the second transistor cell.

9. The semiconductor device of claim 7, wherein a doping concentration of the first conductive material in the first doped region is higher than that of the first conductive material in the second well and the substrate.

10. The semiconductor device of claim 6, further comprising:

a second doped region, disposed in the second well and electrically connected with the first electrode or the second electrode, having the second conductive material.

11. The semiconductor device of claim 6, wherein the first well is coupled to an operating voltage.

12. The semiconductor device of claim 6, wherein the substrate is coupled to a ground voltage.

* * * * *